APPARATUS AND METHOD FOR PRODUCTION OF EPITAXIAL FILMS

Filed Jan. 3, 1966 Sheet 1 of 2

INVENTORS
JOHN W. BURD
WARREN O. GROVES
BY Robert J. Schaap
ATTORNEY

INVENTORS
JOHN W. BURD
WARREN O. GROVES
BY Robert J. Schaap
ATTORNEY

United States Patent Office 3,441,000

Patented Apr. 29, 1969

3,441,000

APPARATUS AND METHOD FOR PRODUCTION OF EPITAXIAL FILMS

John W. Burd, Chesterfield, and Warren O. Groves, St. Louis, Mo., assignors to Monsanto Company, St. Louis, Mo., a corporation of Delaware Filed Jan. 3, 1966, Ser. No. 521,240
Int. Cl. C23c *13/08;* B05c *11/14*
U.S. Cl. 118—49.1 12 Claims This invention relates in general to the production of semiconductor materials, and more particularly to an improved method and apparatus for the production of epitaxial films of large single crystals.

A large number of problems have been encountered in the growing of epitaxial crystals of a semiconductor for diverse electronic applications. These problems are generally more severe in those areas which employ a ternary system. Generally, the production of semiconductor devices must be performed under the most carefully controlled conditions. The rate of crystal growth must be controlled exactly to insure a desired and uniform epitaxial layer. Moreover, the reactant composition and reaction conditions must be stabilized to attain uniform composition of the mixed crystal. Utmost purity of the semiconductor is necessary which necessitates starting materials of the highest purity and reaction conditions which insure a minimum of contamination. It is also necessary to have controlled and uniform doping of the crystals over wide ranges of doping levels.

The technique of epitaxial deposition for binary and ternary systems involves thermally reversible reactions in a carrier gas. In the region of the source material, the equilibrium of the reversible region is toward the more volatile constituents of the system and is thermally shifted toward the less volatile constituents in the region of the substrates. Thus, semiconductor material is transported from the source region and is deposited on a substrate. When the substrate is a single crystal, the same crystalline orientation and the periodicity of the substrate is maintained. This technique is practiced both in sealed or so-called "closed" systems and in systems involving a steady flow of reactant gas.

The majority of the current reactors for the production of the epitaxial films to be used in the manufacture of semiconductor devices are of the so-called "open-tube" design in which the reactant gases flow into one end of a reactor tube, through the tube, and exit from the opposite end thereof. The flow rates art sufficiently low to be classified as laminar type flow. Upon entering the reaction tube, the reactant gas mixture first encounters a source material at a relatively high temperature where the source may be converted to a volatile halide and another volatile constituent. The halide is generally a Group III halide and the volatile constituent is generally a Group V element. This mixture then passes along the reaction tube to the region of the wafer substrates at a relatively lower temperature. The reactant mixture becomes saturated with respect to the quantity of the volatile Group III halide and the Group V constituent and epitaxial deposition occurs on the substrate wafers. However, the wafers are generally longitudinally aligned with respect to the entering reactant gases and as soon as deposition occurs on the first wafer in the path of the gas, the composition of the gas stream is altered. Therefore, the thermodynamic driving force of the reaction is different with respect to subsequent wafers in the downstream position.

In order to overcome the change of composition with respect to subsequent wafers in the stream of the gas, alteration of the temperature should occur along the length of the reaction tube so that those wafers at the distal end of the tube with respect to the entering reactant gases would have a lower temperature than the wafers or substrates which were located at the proximate end of the tube. However, this type of temperature gradient is difficult to maintain accurately in order to compensate for the depleted reactants in the stream of gas. Consequently, uniform growth rate and, therefore, thickness control from wafer to wafer was poor. Furthermore, the variation in gas composition and deposition temperatures with substrate position introduced variations in compositions for ternary alloy systems and in impurity concentration from wafer to wafer. Consequently, it was often very difficult to maintain composition and desired doping levels in each of the epitaxial films.

It is, therefore, the primary object of the present invention to provide an apparatus and method for producing epitaxial films on single crystal structures.

It is another object of the present invention to provide an apparatus and method of the type stated which compensates for the non-uniformity of film deposition by controlling crystal growth to insure a desired and uniform epitaxial layer.

It is another object of the present invention to provide an apparatus and method of the type stated where reactant composition and reaction condition are stabilized to attain a uniform composition of mixed crystal.

It is also an object of the present invention to provide an apparatus and method of the type stated where controlled and uniform doping of the crystals is achieved over a wide range of doping levels.

It is another salient object of the present invention to produce an apparatus of the type-stated which can be economically constructed, and a method of the type stated which can be performed in a minimal amount of time.

With the above and other objects in view, our invention resides in the novel features of form, construction, arrangement and combination of parts presently described and pointed out in the claims.

FIGURE 1 is a vertical sectional view showing in side elevation an apparatus for the production of epitaxial films constructed in accordance with and embodying the present invention;

FIGURES 2 and 3 are vertical sectional views taken along lines 2—2 and 3—3, respectively of FIGURE 1;

Figure 8:
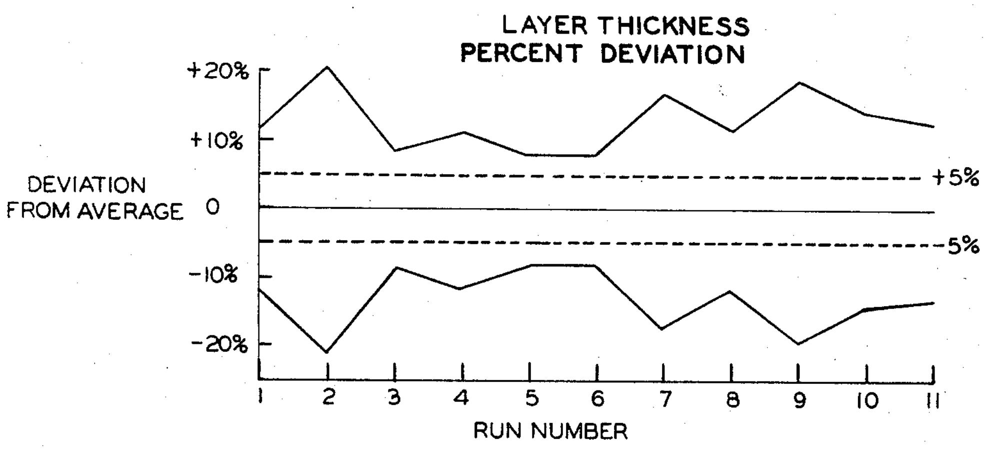
Figure 9:
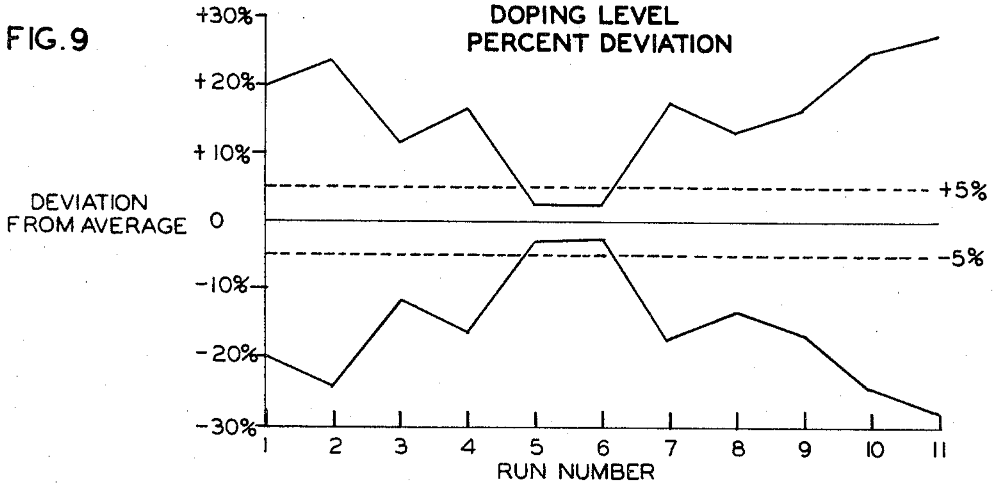

FIGURE 8 is a graphic illustration showing the percentage of deviation from a normal value of layer thickness by devices constructed in accordance with prior art methods and devices constructed in accordance with the present invention; and FIGURE 9 is a graphic illustrtaion showing the percentage of deviation from a normal value of doping level by devices constructed in accordance with prior art methods and devices constructed in accordance with the present invention.

GENERAL DESCRIPTION

Generally speaking, the present invention relates to a modified form of open ended epitaxial deposition reactor. The reactor is subdivided into three chambers which also serve as three temperature zones. For the purposes of the present invention, the first chamber generally serves as a reaction chamber, the second chamber generally serves as a mixing chamber and the third chamber serves as a deposition chamber. The reactant gas mixture used in the reactor of the present invention can be prepared in any of a number of conventional ways. One of the preferred methods used in the practice of the present invention is the introduction of a reactant gas preferably containing a Group V halide into the reaction chamber where it reacts with a source material preferably containing a Group III element. This source material is then converted to a Group III halide. This mixture is then passed into the mixing chamber where a dopant may be admixed with the reactant gas. The gases are introduced into the various chambers at a relatively high flow rate through nozzles or orifices so that considerable agitation is produced.

The deposition chamber which is also an isothermal chamber is designed so that each of the wafers which may be longitudinally aligned with respect to the entering gas streams is maintained at a relatively constant temperature. Furthermore, the wafer temperature may be cooler than the temperature of the deposition chamber. This cooling mechanism is established by means of a cooling fluid which is passed through the support on which the wafers are seated. The deposition chamber is provided with a conically shaped end wall opposed to the entering gas stream and the apex of the conically shaped section being in horizontal alignment with the gas inlet port or orifice. By means of this construction, the entering gases are propelled into this isothermal chamber at a high rate of speed, thereby preventing uneven deposition on the longitudinally disposed wafers. As the gas strikes the conically shaped end wall, it is, in effect, sprayed out and again passes over the wafers. Furthermore, this type of gas flow causes a rapid agitation or circulation of gases in the chamber so that the initial gas does not expend the greater portion of the volatile constituents on the first wafer in the line of the gas stream. Due to the rapid moving and entering of the gas into each of the chambers and particularly the isothermal chamber, the gas is forced out through an annulus around the chamber which serves as a discharge manifold. A three zone furnace surrounds the reactor and provides the desired temperature conditions in each of the three zones.

The present invention also contemplates the employment of a modified form of epitaxial deposition reactor which is similar to the previously described reactor. This latter reactor employs a hemispherical end wall, which is opposed to the entering gas stream. The apex of the hemispherical end wall is maintained in horizontal alignment with the gas jet entering into the isothermal chamber. This type of chamber construction permits the employment of a wafer support element having a trapezoidally shaped inner end which provides a pair of inclined walls for supporting the wafers in a substantially vertical position. This means for supporting the wafers in a substantially vertical position may also be in the form of a separate tray disposed on a flat wafer supporting element.

This type of reactor uniquely lends itself to the preparation of multilayer structures which are required in one continuous operation. This type of continuous operation for preparing multiconfigurations is preferred over a stepwise method where layers of one conductivity type are grown in one operation and where layers of different conductivity types are grown in another operation.

DETAILED DESCRIPTION

Figure 1:
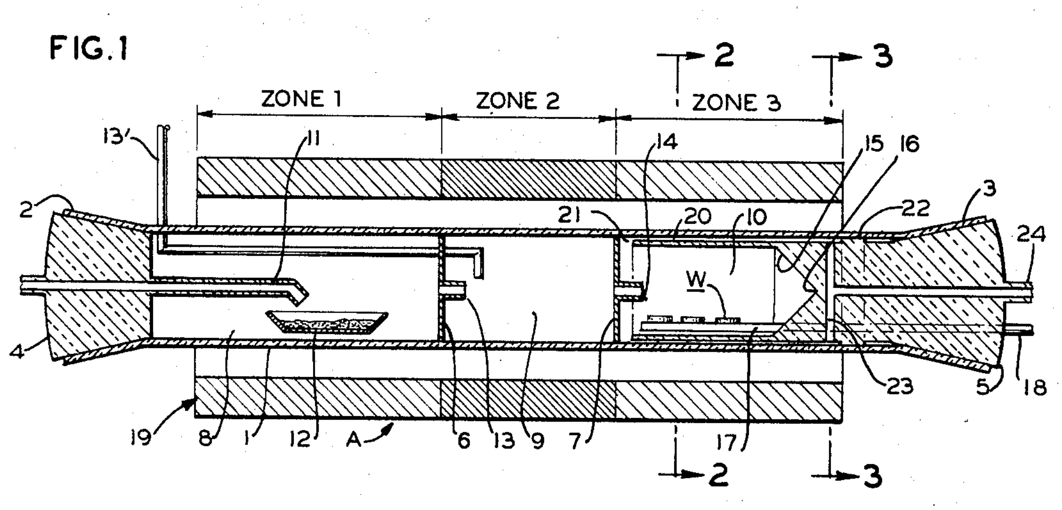

Referring now in more detail and by reference characters to the drawings which illustrate practical embodiments of the present invention, A designates an apparatus for the production of epitaxial deposition films and generally comprises a reaction vessel or tube 1 which is preferably constructed of quartz or any other gas-tight material which is capable of withstanding the high temperature of operation, which is inert to the gaseous reactants, and which does not emit impurities at such temperatures. Other suitable materials are boron nitride, a refractory aluminum oxide and similar refractory materials. The reaction vessel is schematically illustrated in FIGURE 1 and is flared outwardly in the provision of tapered ends 2, 3 for accommodation of end plugs 4, 5. The reaction vessel 1 is also provided intermediate its ends with a pair of axially spaced discs 6, 7 thereby dividing the reaction vessel 1 into a reaction chamber 8, a mixing chamber 9 and a deposition chamber 10.

The reaction chamber 8 or the first chamber, reference being made to FIGURE 1, is provided with a gas inlet tube 11 which extends through the plug 4 and terminates above a container 12 of source material which is preferably a Group III element, a such as gallium. The feed gas admitted through the tube 11 is a halogen-containing gas and preferably a chlorine-containing gas in the form of hydrogen chloride, phosphorus trichloride or arsenic trichloride, for example. The feed gas may contain the Group V element and reacts with the source material to form a volatile Group III halide. The epitaxial growth of III–V compounds is based on the departure of the equilibruim of a reversible reaction between the Group III halides and Group V elements such as for example:

$$3GaCl+\tfrac{1}{2}AS_4\rightleftarrows 2GaAs+GaCl_3$$

The basic principle of the transfer reaction is that the equilibrium shifts towards the left with increasing temperature and towards the right with decreasing temperature. This reaction is surface catalyzed by seed crystals so that deposition occurs on seed crystals more readily than on surrounding surfaces at the same temperatures. It should be understood that the present invention is not limited to this reaction described above.

The reactant gases are then passed into the mixing chamber 9 through a port 13 formed in the disc 6. Also entering the mixing chamber 9 and terminating in close proximity to the terminal end of the discharge port 13 is a dopant feed tube 13'. Any conventional doping material may be used used and may be introduced by any conventional means. For example, the dopant may be introduced in elemental form or as a volatile compound of the dopant element. The quantity of dopant employed is generally controlled by the electrical properties desired in the final product. Suitable amounts contemplated herein are those sufficient to produce concentrations in the range approximately from $1\times10^{15}$ to $5\times10^{20}$ atoms per cubic centimeter of product.

As an alternative to the process of introducing the Group V element with the feed gas into the reaction chamber in the manner described, the inlet gas may contain only the halide carrier in the form of hydrogen and hydrogen halide. The halide carrier will then react with the Group III element in the container 12 forming a volatile Group III halide. The Group V element containing gas is then admitted to the mixing chamber 9 with the dopant through the tube 13'. The gas carrying the volatilized Group III element will then mix with the gas containing the Group V element in the mixing chamber 9.

It has been found to be desirable to employ a chloride transport system in the practice of the present invention. This system is far preferable to systems which employ an oxide intermediate as the oxide systems generally require higher temperatures than a halide system. These higher temperatures increase the contamination through reaction of the volatile species with the reactor materials. Furthermore, appreciable amounts of undesired oxides are incorporated in the epitaxial film when an oxide transport is employed. The other halides, such as bromides and iodides require lower deposition temperatures which may not be suitable in all cases and it has also been found that some substrate orientations do not grow suitably in iodide or bromide systems. However while chloride present the preferable transport media, it should be recognized that the other halides lay be used in most cases.

The reactant gases which have been thoroughly mixed in the mixing chamber 9 are then passed into the deposition chamber 10 at a high velocity through an inlet port 14 formed in the disc 7. In fact, it has been found that a suitable gas velocity into the deposition chamber 10 is within the range of $5 \times 10^2$ centimeters per second to the sonic velocity of the gas. This velocity causes turbulence and consequent thorough mixing in the chamber 10. The creation of these velocities is a wide departure from the laminar flows generally employed in the prior art, which were in the range of 0.5 centimenter per second.

The deposition chamber 10 is formed with a conically shaped end wall 15 having an apex 16 which is preferably in horizontal alignment with the inlet port 14, substantially as illustrated in FIGURE 1. Thus, the gases which are introduced into the deposition chamber 10 through the inlet port 14 are directed at the apex 16. The speed of these entering gases is sufficient so that a condition of turbulence is created where the new gas is mixed with the remaining gas in the chamber. In this manner, deposition occurs from the mixture of gases in the chamber 10 rather than from the new gas at the entry into the deposition chamber 10. The gas which enters the deposition chamber 10 will immediately contact the existing gas molecules in this chamber causing agitation and rapid circulation of all gases in the deposition chamber 10. Consequently, no one portion of the gas stagnates over any individual area. Furthermore, this entering velocity is sufficient so that some of the gas which enters the chamber 10 will strike the apex 16 and cause a spray effect to occur; that is to say, the gas will tend to follow the contour of the end wall 15. Furthermore, as the gas jet strikes the end wall 15, collision will reduce the speed of the gas molecules thereby increasing the retention time in the chamber and permitting greater contact with the wafer substrates.

Extending through the end plug 5 and into the interior of the deposition chamber 10 is a wafer support plate 17, which is preferably made of the same material as the reaction vessel 1. The support plate 17 is preferably positioned below the inlet port 14 and is preferably sufficiently wide so that at least two rows of longitudinally positioned wafers *w* can be supported thereon. The wafer support plate 17 is provided with a fluid duct 18 for accepting a coolant. The fluid duct 18 passes through the plate 17 under each of the rows of wafers and is connected to a suitable source of coolant (not shown) by any convenient fluid line (also not shown).

Figure 7:
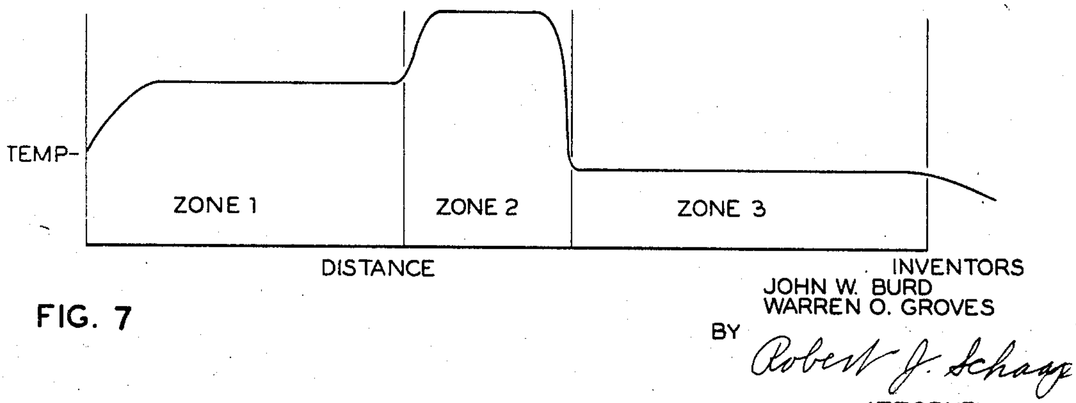
FIGURE 7 is a diagrammatic view showing the temperature gradient employed across the apparatus of the present invention and the operation thereof.

A convention three zone furnace 19, preferably of the radiant energy type is disposed about the reaction vessel 1 in the manner as illustrated in FIGURE 1. The furnace 19 is designed to produce a temperature gradient of the type illustrated in FIGURE 7 across the reaction vessel 1. Thus, it can be seen that the temperature initially rises to the desired reaction temperature in zone 1, which is preferably in the range of 400° to 1100° C. Thereafter, the temperature is increased substantially to a temperature within the range of 500° to 1200° C. in the mixing zone or chamber 9. This higher temperature level is maintained substantially constant for the greater portion of zone 2. Thereafter, the temperature is markedly dropped in zone 2 immediately prior to the deposition zone or deposition chamber 10. Consequently, the entire deposition chamber 10 is maintained at an isothermal temperature for purposes of creating deposition of the epitaxial film on the wafers *w*. The isothermal temperature is preferably in the range of 400° to 1100° C. in order to produce the deposition of the epitaxial film in the deposition chamber 10. It should be understood that this temperature range is varied for the different compositions of the epitaxial film and for the different gas flow rates. As indicated above, the reaction is also surface catalyzed so that deposition occurs more readily on the wafers *w* than on the surrounding surfaces at the same temperature. Furthermore, the gas phase mass transfer and crystallographic orientation also have significant effects on the deposition rate. In addition to this, the cooling of the wafer support plate and the wafers *w* disposed thereon to a temperature which is approximately 10° C. or more below the temperature in the deposition chamber also causes preferential deposition on the wafers *w*.

The plug 5 is provided with an annular side wall which is diametrally reduced with respect to the inner diameter of the reaction vessel 1 and provides an annular exhaust space or so-called "manifold" 20. Furthermore, the side wall of the plug 5 terminates a short distance before the disc 7, thereby providing an annular exhaust port 21. By reference to FIGURE 1, it can be seen that the end wall 15 forms a left hand portion of a solid disc 22, which is provided with a series of radial apertures 23, the latter communicating with the annular exhaust manifold 20. Furthermore, the radial apertures 23, in turn communicate with an exhaust pipe 24, extending through the plug 5 in the manner as illustrated in FIGURE 1. Thus, it can be seen that the gases which are admitted to the deposition chamber 10 will flow outwardly through the annular exhaust port 21, through the exhaust space 20, then through the radial apertures 23 and out through the exhaust pipe 24.

By means of the above outlined construction, it can be seen that the high velocity of the gas mixture through the inlet port 14 creates a turbulence in the deposition chamber 10 and maintains a constant gas composition above the wafers *w*. Due to this constant agitation of the gas, there is no preferential deposition on the first wafer in the line of the gas stream. Inasmuch as there is no preferential deposition of epitaxial film, the composition and doping level of the film on each of the wafers *w* is also substantially the same.

It can also be seen that the unique reactor design readily lends itself to an ability to prepare a multilayered structure in one continuous operation. As indicated previously, this type of operation for preparing the multilayer configuration is preferred over a stepwise method where layers of one conductivity type are grown in one operation and layers of a different conductivity type are grown in another operation. Such a "stepwise" procedure necessarily lengthens the production cycle and increases the probability of contamination of the grown layers. A stepwise method also adds difficulty in the controlled growing of the graded junction. In accordance with the procedures of the present invention, it is now possible to change doping agents by ceasing the flow of dopant into the mixing chamber, flushing the entire system with an inert gas such as hydrogen and changing dopant gases. The gas flows into the reaction vessel are maintained at sufficiently high velocity so that backflow into the source of the Group III element is prevented and contamination thereof is thereby prevented. Accordingly, it is now possible to switch dopant gases without fear of contaminating the source of Group III material. This present method thereby avoids the difficulty previously employed in the stepwise growing of graded junctions.

It should also be recognized that this apparatus and method is particularly adaptable for use with gallium phosphide and gallium arsenide systems. If a gallium arsenide-phosphide epitaxial layer is to be formed on the wafer *w*, the reactant gases in the feed tube 11 are preferably phosphorous trichloride, arsenic trichloride and hydrogen. Consequently, the dopant admitted in the dopant tube would contain pure hydrogen and would contain the dopant plus hydrogen. However, if the carrier gas is merely hydrogen and hydrogen chloride; phosphine, arsine, the hydrogen and dopant are added through the dopant tube 13'. In either case, gallium arsenide-phosphide alloy is formed and deposited on the wafers *w*.

It should also be recognized that epitaxial films formed in accordance with this invention comprise compounds formed from the elements of Group III–B of the periodic system and particularly those having atomic weights of from 10 to 119 and elements selected from Group V–B having atomic weights of from 12 to 133. Included in this group of compounds are the nitrides, phosphides, arsenides and antimonides of boron, aluminum, gallium and indium. The bismuthides and thallium compounds, while operable, are less suitable. In addition to the use of the above compounds by themselves, mixtures of these compounds are also contemplated as epitaxial films, e.g., aluminum nitride and indium antimonide mixed in varying proportions when produced by the instant process produce suitable semiconductor compositions.

Other combinations of elements within the above group which are contemplated herein include ternary and quaternary compositions, or mixed binary crystals, such as combinations having the formulae $GaAs_xP_{1-x}$, $InAs_xP_{1-x}$, $GaP_xN_{1-x}$, $AlP_xAs_{1-x}$, $Ga_xIn_{1-x}As$, $$Ga_xIn_{1-x}P$$

$In_xGa_{1-x}Sb$, $Ga_xAl_{1-x}P$, $Ga_yIn_{1-y}As_xP_{1-x}$ and $$GaAs_x(P_yN_{1-y})_{1-x}$$

where $x$ and $y$ have a numerical value greater than zero and less than one.

Materials useful as substrates herein include the same materials used in the epitaxial films as just described and, in addition, compounds of elements of Groups II and VI (II–VI compounds) and compounds of Groups I and VII elements (I–VII compounds), and the elements silicon and germanium are suitable substrates. Suitable dimensions of the seed crystal are 1 mm. thick, 10 mm. wide and 15–20 mm. long, although larger or smaller crystals may be used.

It should be appreciated that by following the teaching of this invention it is possible to form semiconductor bodies having a plurality of layers of differing conductivities, wherein the width of each layer may be precisely controlled. This allows the transition region or junction, if different type conductivity layers are involved, to be accurately positioned in the semiconductor body. It is also possible to provide in any layer formed, any variation in conductivity desired in any plane parallel to the transition region by varying the concentration of vapor source of active impurity atoms in the flow to the reaction chamber during formation of the layer. The benefits from flexibility of such controls, compared to prior art techniques for forming transition regions, are immediately apparent.

As illustrated by the devices shown, any desired type of semocinductor devices may be made by utilizing the method of the present invention. In each case, the semiconductor device will include at least two layers of semiconductor material having different conductivities and separated by a transition region. In some instances, the transition region will be a P-N junction, while in other instances it may be a P-I or an N-I junction and in still other instances it may be a sharp transition region between layers of high and low resistivity material of the same conductivity type. It will be appreciated that where reference is made herein to different conductivities in layers in any assembly thereof, that the difference may be either in kind or in degree. In the case of a P-N junction, the layers separated thereby may have the same degree of conductivity (or resistivity) but the type of conductivity will, of course, be different. Alternatively, in the case of, for example, an N+-N transition region the conductivity type will be the same for the layers but the degree of conductivity will, of course, be different. In any case, however, the width of the layers of material and the location and type of the junction or transition region may be very accurately defined and controlled by the method of the present invention.

Figure 4:
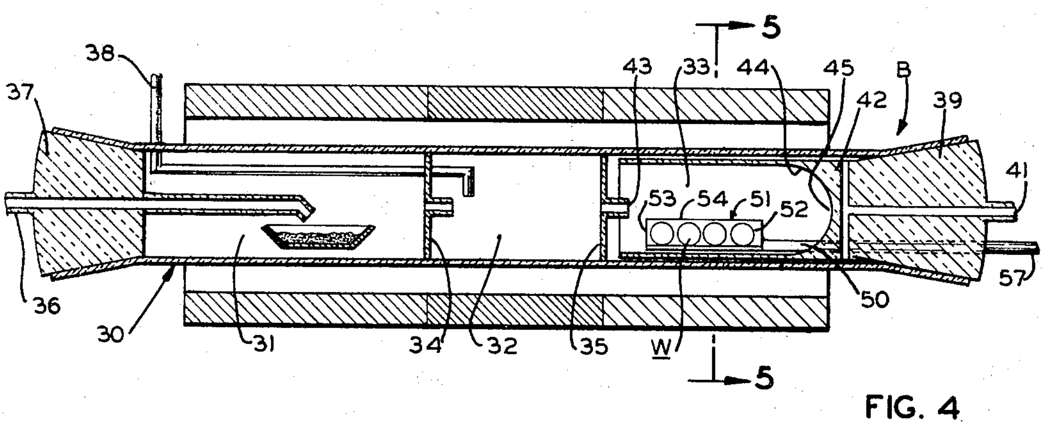
FIGURE 4 is a vertical sectional view similar to the view of FIGURE 1 and showing a modified form of apparatus constructed in accordance with and embodying the present invention.
Figure 2:
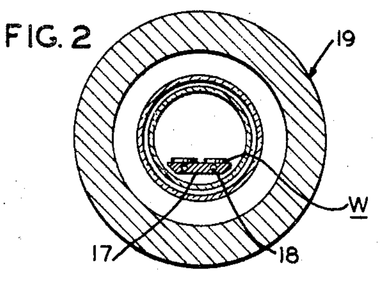
Figure 3:
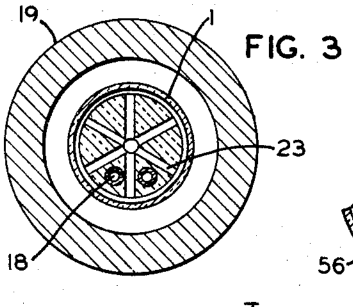
Figure 5:
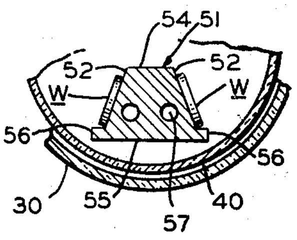
FIGURE 5 is a vertical fragmentary sectional view taken along line 5—5 of FIGURE 4.

It is possible to provide a modified form of epitaxial deposition reactor system B substantially as illustrated in FIGURES 4 and 5 and which is substantially similar to the previously described system A. The epitaxial deposition reactor system B generally comprises a reaction vessel 30, which is similar to the reaction vessel 1 and is also subdivided into a reaction chamber 31, a mixing chamber 32 and a deposition chamber 33 by means of a pair of axially spaced discs 34, 35. The reaction vessel is similarly provided with a gas inlet tube 36, which extends through a plug 37 on the left hand end of the vessel 30, reference being made to FIGURE 4. Similarly, a dopant feed tube 38 extends into the mixing chamber 32.

The right hand end of the vessel 30 is closed by means of a plug 39. The plug 39 accommodates an exhaust tube 41, which is operatively connected to a relatively thick disc 42, the latter serving as part of the exhaust manifold. The disc 35 is provided with a centrally located inlet port 43 in the manner as illustrated in FIGURE 4. The right hand surface of the disc 35, reference being made to FIGURE 4 provides a left end wall for the deposition chamber 33. The solid disc 42 is provided with an inwardly presented hemispherical end wall 44 having an apex 45 in approximate horizontal alignment with the inlet port 43 substantially as illustrated in FIGURE 4. Thus, the gases which are introduced into the deposition chamber 33 through the inlet port 43 are directed at the apex 45 of the hemispherical end wall 44. It should be recognized that the center or so-called apex 45 of the hemispherical end wall 44 is not as well defined as the apex 16 in the conically shaped wall 15. However, this type of deposition chamber design readily lends itself to be used with a different type of wafer arrangement, which is described hereinbelow.

Extending through the end plug 39 and into the interior of the deposition chamber 33 is a wafer support plate 50, which is preferably made of the same material as the reaction vessel 30. The wafer support plate 50 is integrally provided with an enlarged head portion 51, which is trapezoidally shaped in vertical cross section. The head portion 51 comprises a pair of inclined upwardly converging side walls 52, which are connected by end walls 53, a top wall 54 and a bottom wall 55. Moreover, the head portion 51 is integrally provided along its bottom wall 55 with outwardly extending longitudinal wafer support flanges 56. In this manner, wafers *w* are disposed on each side of the head portion 51, lie against the inclined side walls 52 and are supported on the flanges 56. This type of arrangement permits the reaction vessel to be designed with a much smaller diameter reaction tube than in the case of the reaction vessel A. Furthermore, because of the hemispherically shaped wall, the problems of uneven deposition and uneven composition of the epitaxial film have been eliminated.

By further reference to FIGURES 4 and 5, it can be seen that the support plate 50 is positioned so that the top wall 54 is below the inlet port 43 in order to prevent interference with the gas flow into the deposition chamber 33. The wafer support plate 50 is also provided with a fluid duct 57 for accepting a coolant. This fluid duct passes into the plate 50 and is connected to a suitable source of coolant (not shown) by any conventional fluid line (also not shown). It should be recognized that the fluid duct could extend upwardly into the enlarged head 51 adjacent to the side walls 52, if desired.

Figure 6:
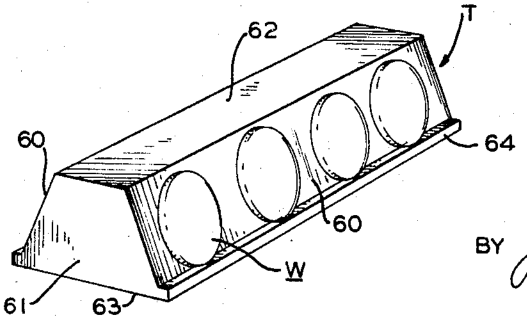
FIGURE 6 is a perspective view of a wafer support tray constructed in accordance with and embodying the present invention.

It is also possible to use a slightly different arrangement of wafer support plate with the reaction vessel 30. A support plate 17 would be positioned in the deposition chamber 33 in the same manner that the support plate 17 was positioned in the deposition chamber 10. A wafer tray T of the type illustrated in FIGURE 6 would then be disposed on the wafer support plate 17 for holding the wafers *w* in the deposition chamber 33. The wafer support tray T is generally trapezoidal shaped in vertical cross section and comprises a pair of inclined upwardly converging side walls 60 which are connected by end walls 61, top walls 62, and bottom walls 63. Moreover, the tray T is integrally formed along its bottom wall 63 and extending outwardly from the side walls 60 with longitudinally extending wafer support flanges 64. In this manner, wafers are disposed on each side of the tray T and lie against the inclined walls 60 and are supported on the flanges 64. This arrangement has also been found to be very suitable for holding the wafers in an inclined position, which suffers slightly from the fact that cooling through the tray T is not as effective as cooling through the enlarged head 50. However, it is many times desirable to use a tray T for the convenience of rapidly loading wafers *w* thereon and preparing the same for receiving epitaxially deposited films.

It should be recognized in connection with the present invention that the epitaxial deposition reaction system B is as versatile as the previously described reaction system A and furthermore, the various films which can be manufactured in the reaction system A can also be manufactured in the reaction system B.

EXAMPLES

The invention is further illustrated by but not limited to the following two examples. These examples exemplify the differences existing between the epitaxial deposition reactors of the prior art and the procedures employed therein and the epitaxial deposition reactors of the present invention and the associated procedures. The first of the examples employs a so-called "open tube" of the prior art type and using the methods of the prior art. The open tube reactor was employed in Example 1 in order to make an accurate comparison to the modified form of open tube reactor of the present invention employed in Example 2.

Example 1

An epitaxial deposition open tube reactor of the prior art type made of quartz is used in this example. A radiant heater is disposed about the reactor and effectively subdivides the reactor into two temperature zones. Connected to one end of the reactor is a source of hydrogen chloride which is passed through a purification train. Also connected to the same end of the reactor is a source of hydrogen which is passed through a palladium purifier. Tellurium doped solid gallium arsenide is disposed in zone 1.

Hydrogen chloride and hydrogen gases are passed through these zones at a flow rate of approximately 100 cubic centimeters per minute. The reactor has an inner diameter of 20 millimeters and an overall length of 36". However, the effective length is only 28".

The substrates are gallium arsenide wafers which are oriented in the 1·0·0 plane (Miller indices). The gases are passed through the reactor for approximately 20 minutes. The substrates are held at approximately 800° C. and the gallium arsenide source region is maintained at approximately 900° C. The deposition portion of the reactor is held to a 10° C. temperature decreasing gradient per inch. The net carrier level $n_d$ type is found to be between $5.2\times10^{16}/\text{cm.}^3 \leq n_d \leq 2.85\times10^{17}/\text{cm.}^3$.

Two wafers are employed in each run for this example and a series of 11 runs are conducted under the same conditions. The wafer on the proximate end is designated as the first wafer in Table 1 set forth below and the wafer on the distal end is designated as the second wafer. The thicknesses in microns of these layers are measured and tabulated in Table 1. The difference of the thicknesses, the averages and the deviation from the average are also calculated and set forth in Table 1. The percentage deviation from the average is plotted for each run in FIGURE 8 and accordingly two curves showing plus and minus values as deviations from the average are plotted in solid lines. These curves show the wide deviation from a zero error value for each of the runs and the difficulty in achieving uniform thickness.

The dopant levels are also measured in each wafer and these data are set forth in Table 2. The difference between the dopant levels of each wafer in a run is calculated and tabulated in Table 2 and similarly the averages and deviations from the normal are also set forth in Table 2. These deviations are plotted in FIGURE 9 and show the wide deviation of dopant levels from the normal.

TABLE 1.—LAYER THICKNESS DATA

| Run No. | 1st. | 2nd. | Diff. | Avg. | Div., percent |
|---|---|---|---|---|---|
| 1 | 6.0 | 7.5 | 1.5 | 6.75 | ±11.6 |
| 2 | 6.0 | 9.2 | 3.2 | 7.6 | ±21.0 |
| 3 | 5.5 | 6.5 | 1.0 | 6.0 | ±8.35 |
| 4 | 3.0 | 3.8 | 0.8 | 3.4 | ±11.75 |
| 5 | 5.0 | 5.9 | 0.9 | 5.45 | ±8.25 |
| 6 | 4.6 | 5.4 | 0.8 | 5.0 | ±8.0 |
| 7 | 3.6 | 5.1 | 1.5 | 4.35 | ±17.25 |
| 8 | 4.5 | 5.7 | 1.2 | 5.10 | ±11.75 |
| 9 | 3.8 | 5.6 | 1.8 | 4.7 | ±19.2 |
| 10 | 6.0 | 8.0 | 2.0 | 7.0 | ±14.3 |
| 11 | 4.4 | 5.7 | 1.3 | 5.05 | ±12.9 |

TABLE 2.—DOPING LEVEL DATA

| Run No. | Doping levels ($\times10^{17}$) | Diff. | Avg. | Dev., percent |
|---|---|---|---|---|
| 1 | 1.72–1.15 | 0.57 | 1.435 | ±19.8 |
| 2 | 0.79–1.29 | 0.50 | 1.04 | ±24 |
| 3 | 1.9–2.4 | 0.50 | 2.15 | ±11.6 |
| 4 | 1.65–2.3 | 0.65 | 1.975 | ±16.4 |
| 5 | 1.9–2.0 | 0.10 | 1.95 | ±2.6 |
| 6 | 2.85–2.78 | 0.07 | 2.82 | ±2.5 |
| 7 | 1.4–2.0 | 0.6 | 1.7 | ±17.6 |
| 8 | 2.0–2.6 | 0.6 | 2.3 | ±13.1 |
| 9 | 0.93–1.3 | 0.37 | 1.11 | ±16.7 |
| 10 | 1.08–1.8 | 0.72 | 1.44 | ±25 |
| 11 | 0.52–0.92 | 0.40 | 0.72 | ±27.8 |

EXAMPLE 2

This example employs an epitaxial deposition reactor constructed in accordance with the present invention. The reactor vessel is divided into three chambers, namely a reacting chamber, a mixing chamber, and a deposition chamber. The reaction tube has a diameter of 50 millimeters and is approximately 30 inches long. The reaction chamber has a length of 8 inches, the mixing chamber has a length of 5 inches and the deposition chamber has a length of 6 inches.

Hydrogen chloride gas at a flow rate of 5 cubic centimeters per minute is mixed with pure hydrogen at approximately 650 cubic centimeters per minute and passed into the reaction chamber. Hydrogen is passed through a palladium purifier prior to mixing with the hydrogen chloride. The gas stream in the reaction chamber is passed over a source of elemental gallium maintained at 500° C. The resulting mixture is then passed through a small orifice into the mixing chamber.

A mixture of 2% by volume phosphine in hydrogen at a flow rate of 100 cubic centimeters per minute and a mixture of 2% by volume arsine in hydrogen at a flow rate of 250 cubic centimeters per minute are combined and passed over an elemental tellurium dopant which is maintained at approximately 350° C. in a separate doping chamber. This dopant gas is then introduced into the mixing chamber. Back flow of the dopant material into the gallium source is prevented by a relatively high velocity of flow of gas through the port from the reaction chamber into the mixing chamber. Furthermore, the mixing chamber is maintained at approximately 900° C. to prevent deposition of gallium arsenide-phosphide represented by the formula $GaAs_{1-x}P_x$.

The reactant gas mixture is then passed through a 0.017" diameter orifice into the deposition chamber which contains 8 gallium arsenside substrate wafers, 18 millimeters in diameter by 0.25 millimeter thick. The wafers are arranged in two longitudinally aligned rows of four wafers per row where a deposition of the gallium arsenide-phosphide epitaxial layer takes place on each of the substrates. The deposition chamber is maintained at 850° C. and the wafers are maintained at 840° C. The flow of hydrogen chloride gas is continued for 30 minutes and then the system is flushed with pure hydrogen for an additional 10 minutes. The reaction vessel is cooled by removal from the furnace and flushed with argon. The epitaxial gallium arsenide-phosphide alloy layers are found to have the following properties:

Thickness—8 microns with a maximum range of 7.6 microns to 8.4 microns;
microns;
Composition—mole fraction of gallium phosphide is 0.415 with a maximum range of 0.41 to 0.42; and
Net carrier levels (N type) where $n_d$ is equal to $1.4\times10^{18}$ $cm.^{-3}$ with a maximum range of $1.3\times10^{18}$ to $1.5\times10^{18}$ $cm.^{-3}$.

The composition, thickness and the dopant level deviation from the average are illustrated in the dotted lines of FIGURES 8 and 9, respectively, as a comparison with the plots from Example 1. It can be seen that the plot of deviation from the average in the composition is approximately 5% and the deviation from the normal for dopant levels is also approximately 5%. The achievable results with the apparatus of the present invention are far superior to the achievable results by prior art methods and apparatus.

It should be understood that changes and modifications in the form, construction, arrangement and combination of parts presently described and pointed out may be made and substituted for those herein shown without departing from the nature and principle of our invention.

Having thus described our invention, what we desire to claim and secure by Letters Patent is:

1. An epitaxial deposition reaction system for deposition of an epitaxial film on a substrate, said reaction system comprising:

(a) a reaction vessel having a reaction chamber, a mixing chamber and a deposition chamber,
(b) means for creating an epitaxial reactant gas mixture in said reaction chamber,
(c) aperture means between said reaction chamber and said mixing chamber for introducing said reactant gas mixture into said mixing chamber,
(d) orifice means providing communication between said deposition chamber and said mixing chamber so that said epitaxial reactant gas mixture is admitted to said deposition chamber at an initial high velocity to provide gas mixing and prevent non-uniform deposition of said epitaxial film,
(e) a wall in said deposition chamber opposed from the means providing communication and having a shape so that the gas admitted to said deposition chamber becomes rapidly circulated over a substrate in said deposition chamber causing the epitaxial film to be uniformly deposited on said substrate;
(f) and heating means surrounding said reaction vessel, said heating means being adapted to maintain said reaction chamber and said mixing chamber at a different temperature than said deposition chamber.

2. The epitaxial deposition reaction system of claim 1 further characterized in that said heating means is designed to produce three temperature zones and wherein the first temperature zone is created in said reaction chamber, the second temperature zone is created in said mixing chamber at a higher temperature than said first zone and the third zone is created in said deposition chamber at a lower temperature than said first or second zones.

3. The epitaxial deposition reaction system of claim 1 further characterized in that the wall in said deposition chamber is conically shaped and the apex of said conically shaped wall is in approximate alignment with said orifice means.

4. The epitaxial deposition reaction system of claim 1 further characterized in that the wall in said deposition chamber is hyperbolically shaped and the apex of said hyperbolically shaped wall is in approximate alignment with said orifice means.

5. The epitaxial deposition reaction system of claim 1 further characterized in that the reactant gas mixture is a mixture comprising two elements and the means for creating the reactant gas mixture is a source of the first element in said reaction chamber, feeding means connected to said reaction chamber for introducing a carrier gas containing a second element in said reaction chamber thereby contacting said first element and volatilizing said first element, aperture means for introducing said mixture into said mixing chamber, and means for adding doping material to said mixing chamber and causing contact with the gas mixture from said reaction chamber.

6. The epitaxial deposition reaction system of claim 5 further characterized in that the first element is an element from Group III of the periodic chart of elements and the second element is an element from Group V of the periodic chart of elements.

7. The epitaxial deposition reaction system of claim 1 further characterized in that the reactant gas mixture is a mixture comprising two elements and the means for creating the gas mixture is a source of the first element in said reaction chamber, a feeding means connected to said reaction chamber for introducing a carrier gas into said reaction chamber for contacting said first element and volatilizing said first element, aperture means for introducing said gaseous mixture into said mixing chamber, and means for introducing a second element containing gas into said mixing chamber and causing contact with said first gaseous mixture, said last named means being capable of adding a dopant with said second gas into said mixing chamber.

8. The epitaxial deposition reaction system of claim 7 further characterized in that the first element is a metal from Group III of the periodic chart of elements and the second element is an element from Group V of the periodic chart of elements.

9. The epitaxial deposition reaction system of claim 1 further characterized in that a substrate supporting element is disposed in said deposition chamber and fluid cooling means is connected to said substrate supporting element to cause the element and substrate disposed thereon to be cooled below the temperature of the gases in said deposition chamber.

10. The epitaxial deposition raaction system of claim 1 further characterized in that an annular exhaust space is disposed around said deposition chamber for withdrawing the exhaust gases from said deposition chamber.

11. The epitaxial deposition reaction system of claim 1 further characterized in that a tray is disposed in the deposition chamber and the substrates are supported on said tray, said tray having a pair of oppositely inclined side walls and base flanges extending outwardly from the side walls for supporting said substrate.

12. The epitaxial deposition reaction system of claim 1 further characterized in that a substrate supporting element is disposed in the deposition chamber, said substrate supporting element comprising a relatively flat plate having an enlarged head portion, said enlarged head portion having a pair of inclined walls with outwardly extending flanges along the base thereof for supporting the substrate in an inclined position.

References Cited

UNITED STATES PATENTS

| | | | |
|---|---|---|---|
| 2,831,784 | 4/1958 | Gastinger | 117--106 XR |
| 2,893,850 | 7/1959 | Von Bichowsky. | |
| 3,009,834 | 11/1961 | Hanlet | 148—174 XR |
| 3,058,812 | 10/1962 | Chu et al. | 148—175 XR |
| 3,121,062 | 2/1964 | Gould | 148—175 XR |
| 3,338,761 | 8/1967 | Cheney et al. | 148—175 |

| | | | |
|---|---|---|---|
| 3,345,209 | 10/1967 | Cheroff et al. | 117—107.2 XR |
| 3,354,004 | 11/1967 | Reisman et al. | 148—174 XR |
| 3,361,591 | 1/1968 | Dill et al. | 118—49.1 |
| 3,365,336 | 1/1968 | Folkmann et al. | 118—500 XR |

HYLAND BIZOT, *Primary Examiner.*

P. WEINSTEIN, *Assistant Examiner.*

U.S. Cl. X.R.

118—500; 117—106, 107.2; 148—1.5, 174, 175